(12) United States Patent
Takahashi

(10) Patent No.: US 7,965,368 B2
(45) Date of Patent: Jun. 21, 2011

(54) DISPLAY DEVICE COMPRISING A SEMICONDUCTOR CHIP INCLUDING A FIRST TERMINAL WHICH OVERLAPS A FIRST AND SECOND LINE, THE FIRST TERMINAL CONNECTED TO THE FIRST LINE AND OVERLAPPING AND INSULATED FROM THE SECOND LINE

(75) Inventor: Hiroyuki Takahashi, Funabashi (JP)

(73) Assignee: Hitachi Displays, Ltd., Chiba (JP)

( * ) Notice: Subject to any disclaimer, the term of this patent is extended or adjusted under 35 U.S.C. 154(b) by 89 days.

(21) Appl. No.: 11/772,274

(22) Filed: Jul. 2, 2007

(65) Prior Publication Data

US 2008/0049171 A1 Feb. 28, 2008

(30) Foreign Application Priority Data

Jul. 14, 2006 (JP) ................................ 2006-193987

(51) Int. Cl.
*G02F 1/1345* (2006.01)
*H01L 23/48* (2006.01)
(52) U.S. Cl. ..................... 349/152; 349/151; 257/693
(58) Field of Classification Search .................. 349/149, 349/150, 151, 152; 257/693
See application file for complete search history.

(56) References Cited

U.S. PATENT DOCUMENTS

| | | | | |
|---|---|---|---|---|
| 5,608,559 A | * | 3/1997 | Inada et al. | 349/149 |
| 5,825,439 A | * | 10/1998 | Noriyama | 349/54 |
| 2002/0071086 A1 | * | 6/2002 | Kim et al. | 349/152 |
| 2002/0100974 A1 | * | 8/2002 | Uchiyama | 257/737 |
| 2005/0041191 A1 | * | 2/2005 | Lim | 349/152 |
| 2005/0157243 A1 | * | 7/2005 | Hayata et al. | 349/149 |
| 2005/0263889 A1 | * | 12/2005 | Abe et al. | 257/750 |
| 2005/0286005 A1 | * | 12/2005 | Watanabe et al. | 349/149 |

FOREIGN PATENT DOCUMENTS

| | | |
|---|---|---|
| JP | 08-313925 | 11/1996 |
| JP | 2005-099310 | 4/2005 |

* cited by examiner

*Primary Examiner* — Mark A Robinson
*Assistant Examiner* — Dennis Y Kim
(74) *Attorney, Agent, or Firm* — Antonelli, Terry, Stout & Kraus, LLP.

(57) ABSTRACT

The present invention provides a display device which, in a region on which a semiconductor chip is mounted, can narrow the distance between neighboring line layers and, at the same time, can increase an area of terminals which are connected with bump electrodes of the semiconductor chip. In a display device which includes a substrate having a display part and a peripheral portion, and a semiconductor chip which is mounted on the peripheral portion of the substrate, the semiconductor chip includes a first bump electrode, the substrate includes a first line, a second line which is arranged adjacent to the first line, an insulation film which covers the first line and the second line, a first contact hole which is formed in the insulation film, and a first terminal which is connected to the first line via the first contact hole, the first bump electrode is connected with the first terminal, the second line is electrically insulated from the first terminal, and the first terminal is arranged to overlap the second line by way of the insulation film as viewed in a plan view.

1 Claim, 8 Drawing Sheets

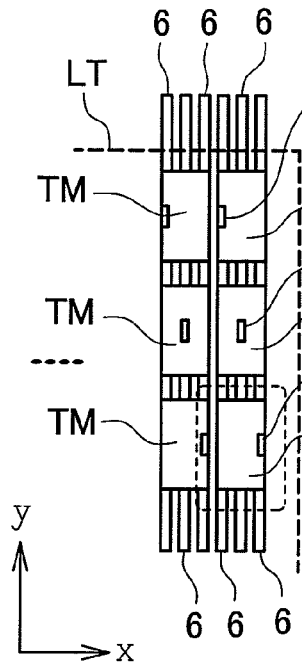 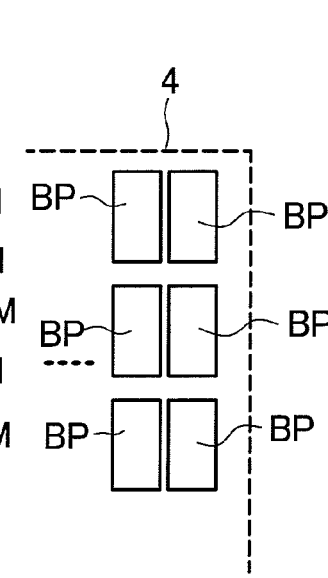 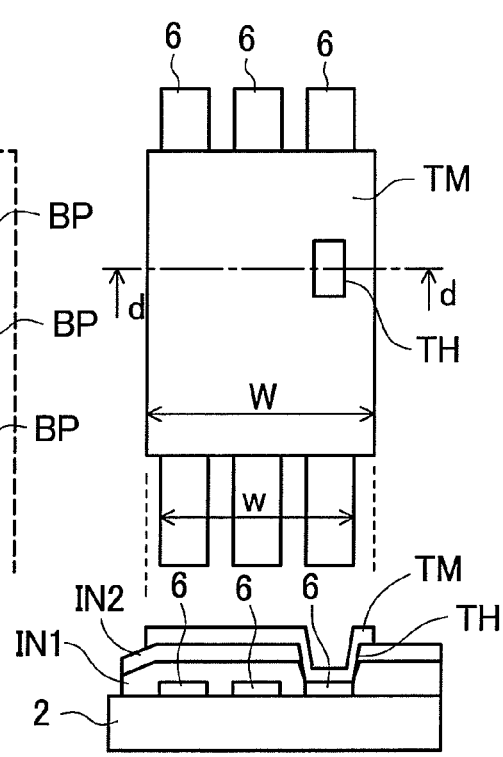
FIG. 1A  FIG. 1B  FIG. 1C
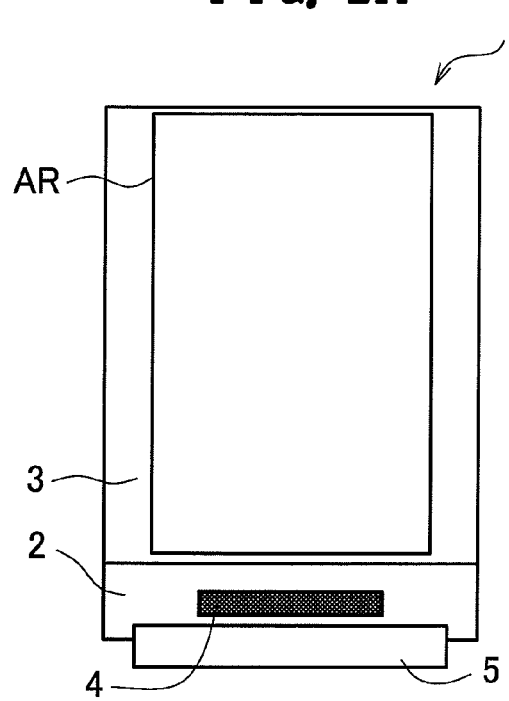 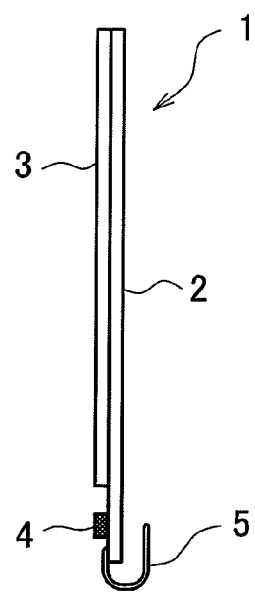
FIG. 2A  FIG. 2B

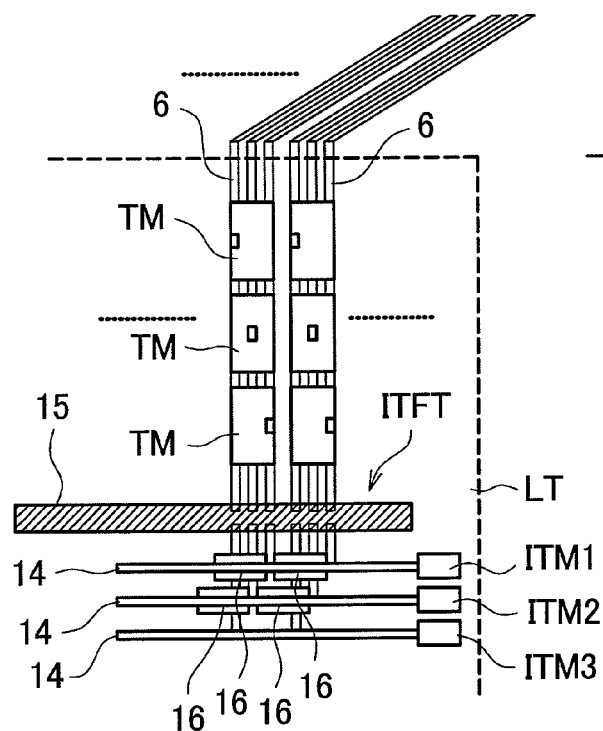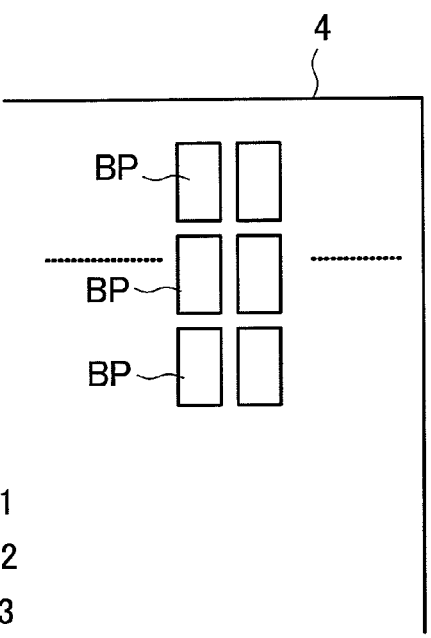
FIG. 8A / FIG. 8B
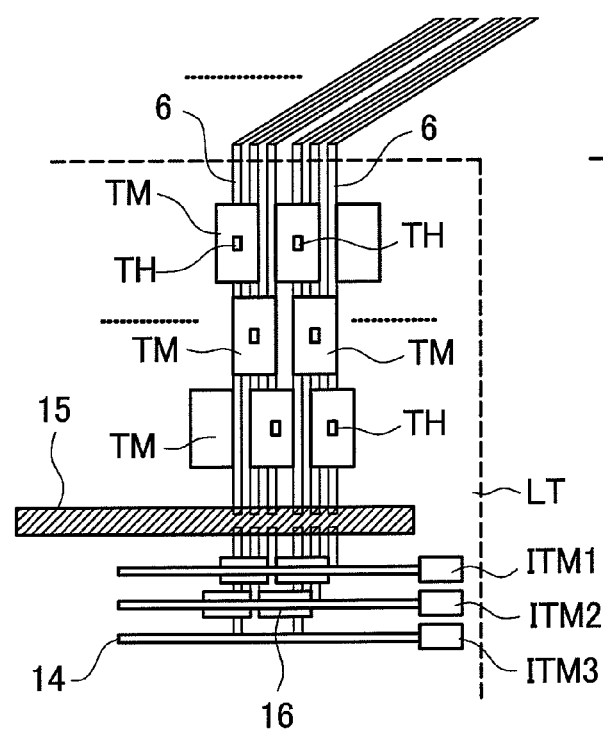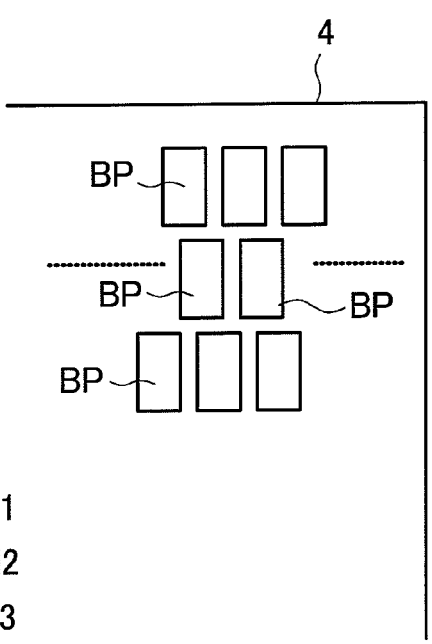
FIG. 9A / FIG. 9B

FIG. 12A
Prior Art
FIG. 12B
Prior Art
FIG. 12C
Prior Art
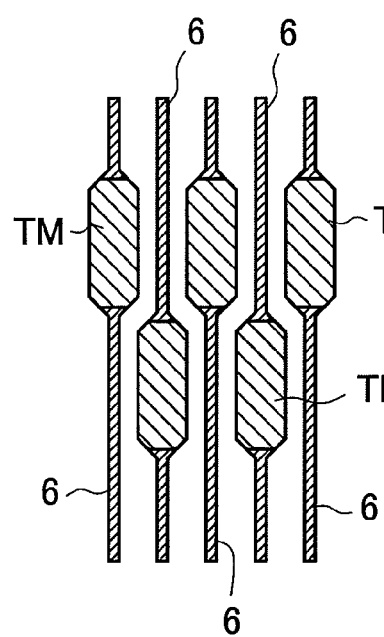
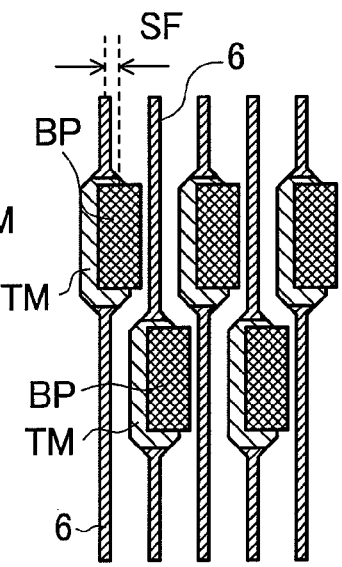
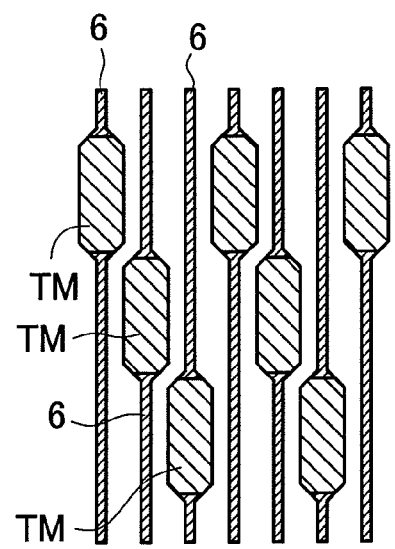

DISPLAY DEVICE COMPRISING A SEMICONDUCTOR CHIP INCLUDING A FIRST TERMINAL WHICH OVERLAPS A FIRST AND SECOND LINE, THE FIRST TERMINAL CONNECTED TO THE FIRST LINE AND OVERLAPPING AND INSULATED FROM THE SECOND LINE

The present application claims priority from Japanese application JP2006-193987 filed on Jul. 14, 2006, the content of which is hereby incorporated by reference into this application.

BACKGROUND OF THE INVENTION

1. Field of the Invention

The present invention relates to a display device, and more particularly to a display device which mounts a semiconductor chip on a substrate thereof.

2. Description of the Related Art

For example, a liquid crystal display device is configured such that a display part of the liquid crystal display device includes a pair of substrates which is arranged to face each other in an opposed manner with liquid crystal interposed therebetween, one substrate out of the respective substrates extends to a region other than the display part (a peripheral portion), and a semiconductor chip which is formed of a liquid crystal display drive circuit is mounted on an extending portion of one substrate.

On a surface of the substrate on which the semiconductor chip is mounted, a plurality of line layers for inputting signals into respective pixels within the display part is formed, wherein the semiconductor chip is mounted on the surface of the substrate by face-down bonding such that respective bump electrodes of the semiconductor chip are connected to terminals of the respective corresponding line layers.

Further, in such a constitution, recently, the number of pixels in the display part is increased and, along with the increase of the number of pixels, the number of line layers which input signals into the respective pixels is increased.

Accordingly, not to mention that it is necessary to form the respective line layers with a small parallel pitch within a region where the semiconductor chip is mounted, it is also necessary to form the respective terminals in a further concentrated pattern.

Here, as one method for forming the respective terminals in a concentrated pattern, for example, as disclosed in the following patent document 1, there has been known a method in which a group of terminals which are constituted of terminals arranged in the parallel direction of the respective line layers are arranged at two stages in the extending direction of the respective line layers, wherein the respective line layers which are arranged for every one other line are connected to the respective terminals of the group of terminals at the first stage, and another remaining respective line layers are connected to the respective terminals of the group of terminals at the second stage. Alternatively, as disclosed in the following patent document 2 which share the substantially same technical concept as patent document 1, there has been known a method which further uses a group of terminals on a third stage.

Here, in the above-mentioned methods, a semiconductor chip is also, to establish the connection thereof with the terminals, constituted of a group of bump electrodes at two stages or a group of bump electrodes at three stages.

Patent Document 1: JP-A-2005-99310

Patent Document 2: JP-A-8-313925

SUMMARY OF THE INVENTION

However, in either one of these constitutions disclosed in patent document 1 and patent document 2, the restriction is imposed in an attempt to narrow the distance between each line layer and another line layer arranged adjacent to such a line layer, or the restriction is imposed in an attempt to increase an area of the terminal.

For example, FIG. 12A is a plan view showing a case in which among respective line layers 6 which are arranged in parallel to each other, respective terminals TM of a group of terminals at the first stage are formed on the line layers 6 for every one other line, and the respective terminals TM of a group of terminals at the second stage are formed on the remaining other line layers 6. Each terminal TM is a place where an electrical connection between the terminal TM and the each bump electrode of the semiconductor chip is established and hence, the terminal TM is formed as a region having a width larger than a width of the line layer 6. Further, to increase an area of each terminal TM as much as possible, the terminals are arranged in a so-called staggered pattern. In this case, the line layer 6 which is connected to the terminal TM at the second stage is arranged at a position between two neighboring terminals TM on one stage.

However, FIG. 12B shows a case in which on the respective terminals TM shown in FIG. 12A, respective bump electrodes BP of the semiconductor chip are arranged (mounted) in a state that the respective bump electrodes BP correspond to the respective terminals TM. In FIG. 12B, only the bump electrodes BP out of the semiconductor chip are illustrated and the illustration of a semiconductor substrate, a package and the like of the semiconductor chip is omitted. In the above-mentioned arrangement of the semiconductor chip, when a displacement of the bump electrodes BP occurs as indicated by SF in FIG. 12B, a contact area between each terminal TM and the corresponding bump electrode BP is decreased and hence, a sufficient electrical connection cannot be achieved. Accordingly, it is desirable to form the terminals TM having a larger area. In this case, however, it is also necessary to ensure a predetermined distance as the distance between the terminal TM and the neighboring line layer 6. As a result, it is inevitably necessary to arrange the neighboring line layers 6 in a spaced-apart manner from each other by an amount corresponding to the increase of the area of the terminal TM.

That is, the conventional staggered arrangement pattern has a following drawback. That is, due to the increase of the area of the terminal TM, it is impossible to narrow the distance between the line layers 6. On the other hand, when the distance between the line layers 6 is narrowed, it is impossible to increase the area of the terminal TM.

Further, FIG. 12C shows the constitution which further forms a group of terminals at three stages by developing the constitution shown in FIG. 12A. However, to compare the constitution shown in FIG. 12C with the constitution which adopts the group of terminals at two stages, the constitution shown in FIG. 12C can merely increase the number of line layers 6 and terminals TM and cannot basically overcome the above-mentioned drawback explained in conjunction with FIG. 12A.

Further, also in the multiple-stage constitution having no staggered pattern which is disclosed in patent document 1 or patent document 2, the line layers 6 which are connected to the terminals TM at the second stage in a state that each line layer 6 is arranged at a position between the two neighboring terminals TM at the first stage. Accordingly, the multiple-stage constitution also has a substantially equal drawback.

Accordingly, it is an advantage of the present invention to provide a display device which, in a region on which a semiconductor chip is mounted, can narrow the distance between neighboring line layers and, at the same time, can increase an area of terminals of the line layers which are connected with bump electrodes of the semiconductor chip.

To briefly explain the summary of typical inventions among inventions disclosed in this specification, they are as follows.

(1) A display device includes a substrate having a display part and a peripheral portion, and a semiconductor chip which is mounted on the peripheral portion of the substrate, wherein the semiconductor chip includes a first bump electrode, the substrate includes a first line, a second line which is arranged adjacent to the first line, an insulation film which covers the first line and the second line, a first contact hole which is formed in the insulation film, and a first terminal which is connected to the first line via the first contact hole, the first bump electrode is connected with the first terminal, the second line is electrically insulated from the first terminal, and the first terminal is arranged to overlap the second line by way of the insulation film as viewed in a plan view.

(2) In the constitution (1), the first bump electrode may be arranged to overlap the second line by way of the insulation film as viewed in a plan view.

(3) A display device includes a substrate having a display part and a peripheral portion, and a semiconductor chip which is mounted on the peripheral portion of the substrate, wherein the semiconductor chip includes a first bump electrode, the substrate includes a first line, a second line which is arranged adjacent to the first line, an insulation film which covers the first line and the second line, a first contact hole formed in the insulation film, and a first terminal which is connected to the first line via the first contact hole, the first bump electrode is connected with the first terminal, the second line is electrically insulated from the first terminal, and the first bump electrode is arranged to overlap the second line by way of the insulation film as viewed in a plan view.

(4) In any one of constitutions (1) to (3), the insulation film may be constituted of insulation films in two or more layers.

(5) In any one of constitutions (1) to (4), the substrate may include a thin film transistor, and the insulation film may include an insulation film made of the same material as a gate insulation film for the thin film transistor.

(6) In any one of constitutions (1) to (5), the first terminal may have at least a surface thereof made of ITO (Indium Tin Oxide).

(7) In any one of constitutions (1) to (6), the semiconductor chip may include a second bump electrode, the substrate may include a second terminal which is connected to the second bump electrode, a distance between the first terminal and the display part may differ from a distance between the second terminal and the display part, and the number of lines on the substrate which overlap the first terminal may be equal to the number of lines on the substrate which overlap the second terminal as viewed in a plan view.

(8) In anyone of constitutions (1) to (7), the peripheral portion of the substrate may include a first inspection terminal and a first switching element, and the first inspection terminal may be connected to the first line via the first switching element.

(9) In any one of constitutions (1) to (8), the semiconductor chip may include a second bump electrode, the substrate may include a second contact hole formed in the insulation film and a second terminal which is connected to the second line via the second contact hole, the second bump electrode may be connected with the second terminal, the first line may be electrically insulated from the second terminal, and the second terminal may be arranged to overlap the first line as viewed in a plan view.

(10) In any one of constitutions (1) to (9), the semiconductor chip may include a plurality of bump electrodes including the first bump electrode on one long side of the semiconductor chip, the plurality of bump electrodes may be arranged at two or more stages in the short direction of the semiconductor chip, and the plurality of bump electrodes may have a longitudinal-direction position of the semiconductor chip of the bump electrodes at the first stage not shifted from a longitudinal-direction position of the semiconductor chip of the bump electrodes at the second stage.

(11) In any one of constitutions (1) to (9), the semiconductor chip may include a plurality of bump electrodes including the first bump electrode on one long side of the semiconductor chip, the plurality of bump electrodes may be arranged at two or more stages in the short direction of the semiconductor chip, and the plurality of bump electrodes may have a longitudinal-direction position of the semiconductor chip of the bump electrodes at the first stage shifted from a longitudinal-direction position of the semiconductor chip of the bump electrodes at the second stage.

(12) In any one of constitutions (1) to (11), the display device may include a counter substrate which is arranged to face the substrate in an opposed manner and liquid crystal sandwiched between the substrate and the counter substrate.

Here, the present invention is not limited to the above-mentioned constitutions and various modifications are conceivable without departing from a technical concept of the present invention.

The display device having such a constitution can decrease a distance between the neighboring line layers in a region where the semiconductor chip is mounted and, further, the display device can increase an area of the terminal of the line layer which is connected to the bump electrode of the semiconductor chip.

BRIEF DESCRIPTION OF THE DRAWINGS

FIG. 1A to FIG. 1C are views showing one embodiment of a display device according to the present invention, and also are views showing a portion of a bump electrode of a semiconductor chip mounted on the display device and a line layer which is connected to the bump electrode;

FIG. 2A and FIG. 2B are whole constitutional views showing one embodiment of the display device according to the present invention;

FIG. 8A and FIG. 8B are views showing another embodiment of the display device according to the present invention;

FIG. 9A and FIG. 9B are views showing another embodiment of the display device according to the present invention;

FIG. 12A to FIG. 12C are views for explaining a disadvantageous point in a conventional display device.

DESCRIPTION OF THE PREFERRED EMBODIMENTS

Figure 3:
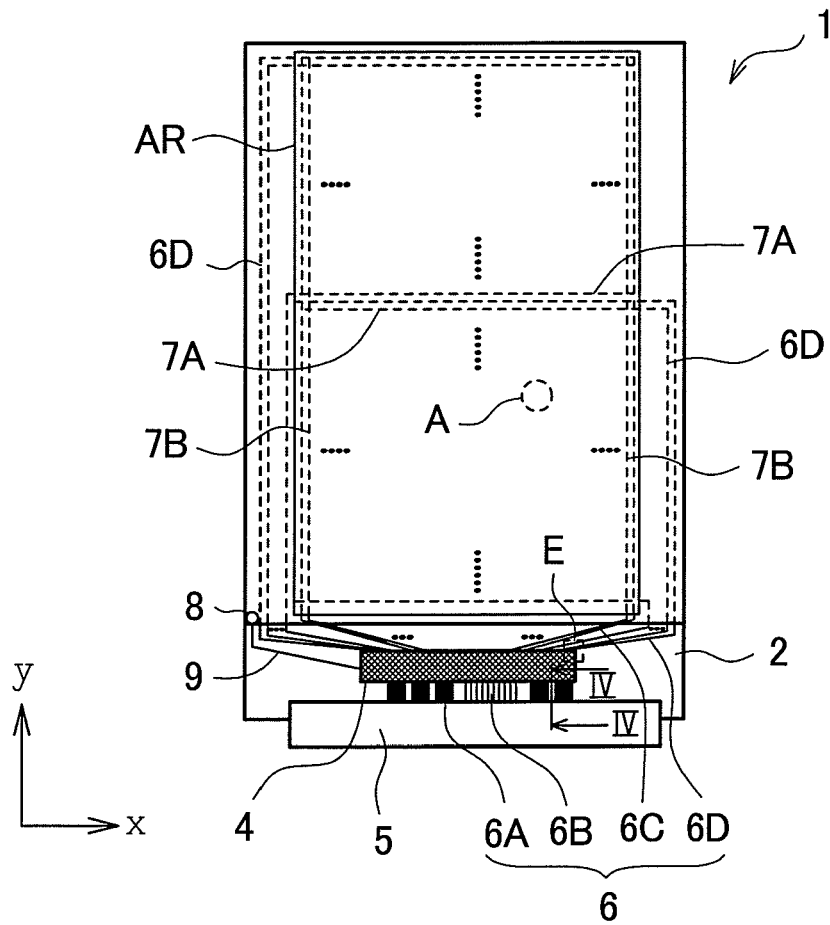
FIG. 3 is a plan view of the line layer which is mounted on the display device shown in FIG. 2A and the semiconductor chip which is connected to the line layer.

Hereinafter, embodiments of a display device according to the present invention are explained in conjunction with drawings.

First of all, FIG. 2A and FIG. 2B are views showing the appearance of a display device of one embodiment according to the present invention, wherein FIG. 2A is a front view and FIG. 2B is a side view.

FIG. 2A and FIG. 2B show a liquid crystal display device, and the liquid crystal display device is used as a display device of a mobile phone, for example.

In FIG. 2A and FIG. 2B, first of all, the liquid crystal display device 1 is constituted of a pair of rectangular substrates 2, 3 which is arranged to face each other with liquid crystal therebetween, and at least either one of the substrates 2, 3 is made of a transparent material. On liquid-crystal-side surfaces of the respective substrates 2, 3, a large number of pixels which is formed in a matrix array is formed, and a mass of the respective pixels forms a liquid crystal display part AR.

Out of the respective substrates 2, 3, for example, an area of the substrate (counter substrate) 3 which is arranged on a front side is set smaller than an area of the substrate 2 which is arranged on a back side. Due to such an arrangement, when the liquid crystal display device 1 is viewed from a front side, in a region below the display part AR in the drawing, the back-side substrate 2 is exposed with a relatively small area. Further, a portion other than the display part AR is referred to as a peripheral portion.

On the region of the substrate 2 exposed as described above, a semiconductor chip 4 which is constituted as a liquid crystal display drive circuit is mounted. Further, a flexible substrate 5 is fixed to a lower-side side of the substrate 2 in the drawing which is arranged adjacent to the semiconductor chip 4.

Power source and signals from an external circuit which is separately formed on the liquid crystal display device 1 are inputted into the semiconductor chip 4 via the flexible substrate 5, and output signals from the semiconductor chip 4 are inputted into the respective pixels which are formed between the respective substrates 2, 3.

FIG. 3 is a view which shows, in the liquid crystal display device 1, line layers 6A, 6B which connect the flexible substrate 5 and the semiconductor chip 4 and line layers 6C, 6D which connect the semiconductor ship 4 and respective pixels within the display part AR. FIG. 3 corresponds to FIG. 2A. The line layers 6 are also referred to as lead lines and FIG. 3 are constituted of one or more line layers out of the line layers 6A, 6B, 6C, 6D.

The line layer 6 which is arranged between the flexible substrate 5 and the semiconductor chip 4 is constituted of a large number of line layer groups which is arranged in parallel on the surface of the substrate 2 and, for example, some of the line layer groups arranged on both sides of the surface are formed as the line layer 6A which supplies the power source and the other line layer groups are formed as the line layer 6B which supplies signals.

In the display part AR, row line layers 7A which extend in the row direction (x direction in the drawing) and column line layers 7B which extend in the column direction (y direction in the drawing) are arranged in a state that the row line layers 7A and the column line layers 7B intersect each other. Scanning signal lines (also refereed to as gate signal lines) or common signal lines correspond to the row line layers 7A, for example, and video signal lines (also referred to as drain signal lines or data lines) correspond to the column line layers 7B, for example. The row line layers 7A and the column line layers 7B are respectively connected to pixels within the display part AR.

The line layer 6 between the semiconductor chip 4 and the respective pixels within the display part AR is constituted of the line layers 6C which lead the column line layers 7B to the semiconductor chip 4 and the line layers 6D which lead the row line layers 7A to the semiconductor chip 4. Here, in FIG. 3, the row line layers 7A is divided in two groups, that is, an upper group and a lower group, wherein the row line layers 7A of the upper group are connected to the line layers 6D on a left side of the liquid crystal display device 1 in the drawing, and the row line layers 7A of the lower group are connected to the line layers 6D on a right side of the liquid crystal display device 1 in the drawing.

In the line layers 6, 7A, 7B having the above-mentioned constitution, by supplying a signal to one of the row line layers 7A, it is possible to select a pixel row which is arranged adjacent to one of the row line layers 7A. In selecting the pixel row, by supplying a video signal to the respective column line layers 7B, it is possible to drive the respective pixels of the pixel row.

Here, for example, a common electrode (transparent electrode) is formed on a whole surface of the upper substrate 3 which faces the liquid crystal, the common electrodes are pulled out to a surface of the lower substrate 2 which faces the liquid crystal via a conductor 8 at a portion of a region outside the display part AR, and is connected to one electrode of the semiconductor chip 4 via a common electrode line layer 9 which is formed on the surface of the lower substrate 2. The common electrode line layer 9 also constitutes one kind of the line layer 6.

On the substrate 2, terminals TM of the line layer 6 are formed. The semiconductor chip 4 is arranged in a state that a main surface (a surface on which the bump electrode is formed) of the semiconductor chip 4 is mounted on the lower substrate 2 in a face-down state and the respective bump electrodes BP arranged in parallel in the longitudinal direction of the semiconductor chip 4 are electrically connected to the terminals TM of the line layers 6. In this case, the respective bump electrodes BP of the semiconductor chip 4 and the respective corresponding terminals TM are electrically connected with each other via, for example, an anisotropic conductive film (not shown in the drawing).

Figure 4:
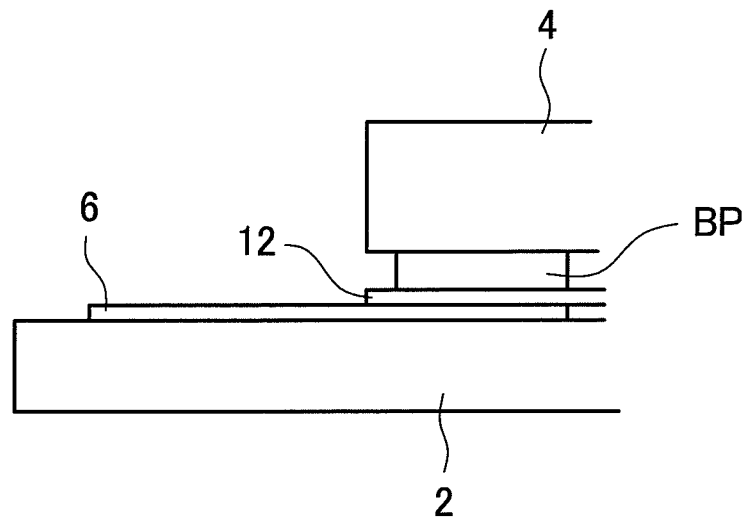
FIG. 4 is a cross-sectional view showing one embodiment of a connection constitution of a substrate and the semiconductor chip in the display device according to the present invention.

FIG. 4 is a cross-sectional view taken along a line VI-VI in FIG. 3. FIG. 4 shows a state in which the semiconductor chip 4 on which the bump electrodes BP are formed is connected to the lower substrate 2 on which the line layers 6 are formed via an anisotropic conductive film 12. The anisotropic conductive film 12 is formed by scattering the conductive-material particles in a resin film, for example. By pushing the semiconductor chip 4 which interposes the anisotropic conductive film 12 between the semiconductor chip 4 and the lower substrate 2 to a lower substrate 2 side, the electrical connection between the line layers 6 (in a strict sense, the terminals TM not shown in the drawing) and the bump electrodes BP is established.

Here, FIG. 4 shows a state in which the semiconductor chip 4 and the line layers 6A, 6B are connected with each other. However, it is needless to say that, by connecting the semiconductor chip 4 to the line layers 6C, 6D in the same manner as described above, the connection of the semiconductor chip 4 with the row line layer 7A, the column line layer 7B and the common electrode line layer 9 is established.

Further, in the flexible substrate 5, arranged are the respective terminals which are connected to line layers formed in the inside of the flexible substrate 5 on one side thereof in parallel. By connecting the respective terminals to terminals (not shown in the drawing) which are formed on end portion of the line layers 6 on a flexible-substrate-5 side via the anisotropic conductive film 12, the flexible substrate 5 is fixed to the lower substrate 2 of the liquid crystal display device 1.

Figure 5A:
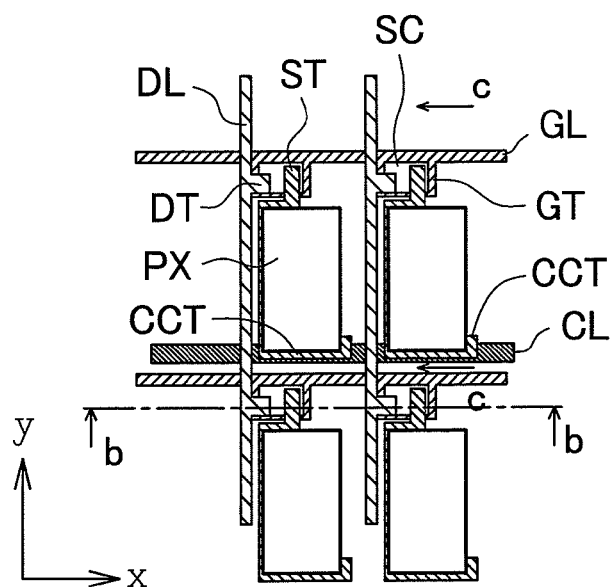
FIG. 5A to FIG. 5C are views showing one embodiment of the constitution of a pixel of the display device according to the present invention.
Figure 5B:
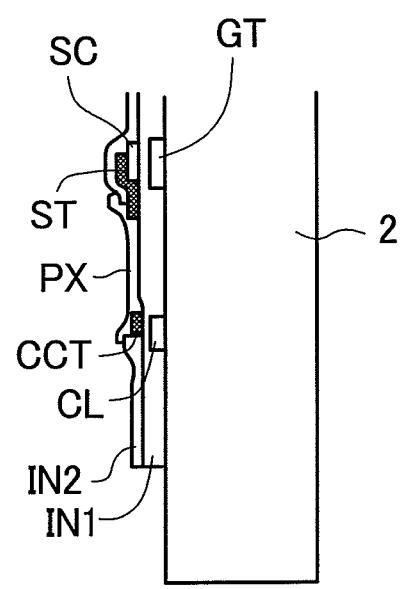
Figure 5C:
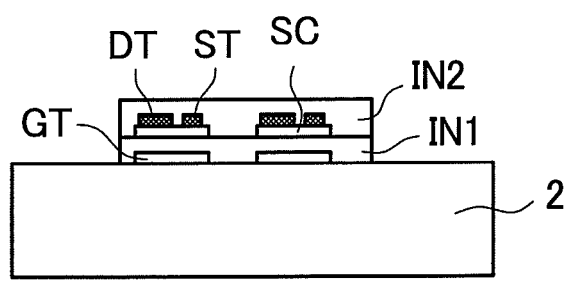

FIG. 5A to FIG. 5C are views showing the constitution of pixels formed in the inside of the display part AR, wherein FIG. 5A is, for example, a plan view of the pixel arranged at a portion indicated by a dotted circular frame A in the drawing within the display part AR shown in FIG. 3. Further, FIG. 5B is a cross-sectional view taken along a line b-b in FIG. 5A, and FIG. 5C is a cross-sectional view taken along a line c-c in FIG. 5A.

First of all, as shown in FIG. 5A, as the above-mentioned row line layers 7A which are arranged in an extending manner in the x direction in the drawing, the gate signal line GL and the common signal lines CL are alternately arranged in the y direction in the drawing in a state that, from above in the drawing, the gate signal line GL, the common signal line CL arranged adjacent to the gate signal line GL in a relatively largely spaced-apart manner from the gate signal line GL, the gate signal line GL arranged close to the common signal line CL, the common signal line CL arranged adjacent to the gate signal line GL in a relatively largely spaced-apart manner from the gate signal line GL, . . . are arranged.

Further, the above-mentioned column line layers 7B which are arranged in an extending manner in the y direction in the drawing are formed as drain signal lines DL in a state that the column line layers 7B are arranged in parallel in the x direction.

Due to such a constitution, a region which is surrounded by the gate signal line GL, the common signal line CL arranged adjacent to the gate signal line GL in a relatively largely spaced-apart manner from the gate signal line GL and a pair of drain signal lines DL which is arranged in parallel defines a pixel region, and one pixel is formed in each pixel region. Here, in case of FIG. 5A, for example, pixels in a two-by-two matrix array are shown.

On a liquid-crystal-side surface of the lower substrate 2, first of all, the gate signal lines GL and the common signal lines CL are respectively formed on the same layer. Further, the gate signal line GL has a portion thereof corresponding to one corner of each pixel region formed to have a large width, and such a portion, as described in detail, is constituted as a gate electrode GT of a thin film transistor TFT.

In this manner, on a surface of the lower substrate 2 on which the gate signal lines GL and the common signal lines CL are formed, for example, a first insulation film IN1 formed of a nitride silicon film is formed in a state that the first insulation film IN1 also covers the gate signal lines GL and the common signal lines CL.

The first insulation film IN1 functions as a gate insulation film in a region where the thin film transistor TFT is formed and functions as a dielectric film in a region where a capacitive element Cstg described later is formed.

Further, on an upper surface of the first insulation film IN1, semiconductor layers SC made of silicon (Si), for example, are formed in a state that the semiconductor layer SC overlaps the gate electrode.

By forming a drain electrode DT and a source electrode ST on an upper surface of the semiconductor layer SC in a spaced-apart manner from each other, an MIS type transistor having the so-called inverse staggered structure is constituted.

Here, for example, the drain electrode DT is integrally formed with the drain signal line DL, and the source electrode ST is formed in a state that the source electrode ST extends to a region where the semiconductor layer SC is not formed and is connected to a pixel electrode PX described later.

Further, a capacitive electrode CCT is formed on the surface of the first insulation film IN1 in a state that the capacitive electrode CCT overlaps a portion of the common signal line CL and, for example, the capacitive electrode CCT is simultaneously formed at the time of forming the source electrode ST.

The capacitive electrode CCT constitutes one electrode of a capacitive element Cstg which uses the first insulation film IN1 as a dielectric film and uses the common signal line CL as another electrode, and the capacitive electrode CCT is connected with the source electrode ST via a line layer which is formed along a portion of a periphery of a region where the pixel electrode PX described later is formed.

Although the electrical connection between the capacitive electrode CCT and the source electrode ST can be established using only a pixel electrode PX described later, for reducing the electric resistance, the above-mentioned line layers is provided.

Further, as described above, on the surface of the lower substrate 2 on which the thin film transistors TFT are formed, a second insulation film IN2 which is, for example, formed of a nitride silicon film and includes openings each of which has respective sides there of arranged slightly inwardly from a region where the pixel electrode PX described later is formed.

The second insulation film IN2 functions as a protective film for preventing a direct contact of the liquid crystal with the thin film transistors TFT. Further, the second insulation film IN2 is configured to form the opening in a most portion of the region where the pixel electrode PX is formed for reducing the attenuation of light transmitting quantity.

Further, the pixel electrode PX which is formed of a transparent electrode is formed in a state that the pixel electrode PX extends over a region ranging from the portion of the second insulation film IN2 where the opening is formed to a peripheral portion of the opening.

The pixel electrode PX is configured to be brought into contact with a portion of the source electrode ST and a portion of the capacitive electrode CCT which are exposed from the opening of the second insulation film IN2 thus establishing an electrical connection thereof with the source electrode ST and the capacitive electrode CCT.

Here, as described above, on the surface of the lower substrate 2 on which the pixel electrodes PX are formed, an orientation film (not shown in the drawing) is formed in a state that the orientation film also covers the pixel electrodes PX so as to determine the initial orientation direction of the liquid crystal molecules which are directly brought into contact with the orientation film.

Further, although not shown in the drawing, on a liquid-crystal-side surface of the upper substrate 3, a common electrode formed of a transparent electrode which is formed in common with respect to the respective pixel regions, a black matrix which is formed to define the respective pixel regions, color filters which are formed to cover opening portions of the black matrix, an orientation film which is arranged to be brought into contact with the liquid crystal and the like are formed.

FIG. 1A is a plan view showing a portion on which the semiconductor chip 4 of the lower substrate 2 is mounted by face down bonding (indicated by symbol LT in the drawing). FIG. 1A shows that the line layers 6 which extend in the y direction and are arranged in parallel in the x direction in the drawing are formed on the surface of the lower substrate 2. FIG. 1A corresponds to a portion indicated by symbol E in FIG. 3. In a strict sense, as shown in FIG. 3, the line layers 6 are bent at a position in the vicinity of a border of the portion LT. However, for facilitating the understanding of the present invention, in FIG. 1A, the explanation is made assuming that the line layers 6 are not bent.

In FIG. 1A, for example, as the line layers 6, only six line layers are shown, for example. Further, FIG. 6 shows six terminals TM which are electrically connected to the respective line layers 6.

The above-mentioned respective terminals TM are formed such that three terminals M are formed along the extending direction of these line layers 6 (direction that a distance from the display part AR is increased) on a left side out of the above-mentioned respective line layers 6 in a state that each terminal TM overlaps three line layers 6, while three terminals M are formed along the extending direction of these line layers 6 on a right side out of the above-mentioned respective line layers 6 in a state that each terminal TM overlaps three line layers 6. Here, the reason that each terminal TM is formed to overlap the neighboring three line layers 6 is to increase an area of each terminal TM as large as possible. Accordingly, in such arrangement of the terminals TM, the line layers 6 do not run between the neighboring terminals TM. In this manner, by overlapping the terminals TM to the neighboring line layers 6, it is unnecessary to increase pitches of the line layers 6 even when the area of each terminal TM is increased and hence, it is possible to make pitches of the line layers 6 and the terminals TM fine.

Further, three terminals TM on a left side in the drawing and three terminals TM on a right side in the drawing are arranged in parallel in the direction perpendicular to the extending direction of the respective line layers 6 (longitudinal direction of the semiconductor chip 4). Although omitted from the drawing, a large number of line layers 6 and terminals TM are arranged in parallel in the same pattern. Such arrangement of the respective terminals TM corresponds to the arrangement of the bump electrodes BP on the semiconductor chip 4 in a face down state as shown in FIG. 1B. That is, FIG. 1B is a view which is drawn in a see-through manner by omitting the semiconductor substrate, a package and the like for explaining the arrangement of the bump electrodes BP on the semiconductor chip 4. The respective bump electrodes BP are respectively positioned to overlap the respective terminals TM shown in FIG. 1A.

That is, the semiconductor chip 4 has a plurality of bump electrodes BP on one long side thereof. Here, the bump electrodes BP are arranged at two or more stages (at three stages in case of FIG. 1B) in the short direction (the direction in which the distance from the display part AR is increased) of the semiconductor chip 4, and the plurality of bump electrodes BP is configured such that the position of the bump electrodes BP of the first stage in the longitudinal direction of the semiconductor chip 4 is not shifted with respect to the position of the bump electrodes BP of the second stage in the longitudinal direction of the semiconductor chip 4. Such arrangement of the bump electrodes BP (not a staggered arrangement) may be also referred to as a multi-stage bump.

Further, as shown in FIG. 1A, three terminals TM which overlap three line layers 6 arranged adjacent to each other and are arranged in parallel in the extending direction of the line layers 6 are respectively electrically connected to the corresponding line layers 6 via respective connection portions (corresponding to contact holes TH described later) which are positionally shifted in the parallel direction of the respective line layers 6. That is, to focus on three terminals TM on a rightmost side and three line layers 6 on a rightmost side, the terminal (the terminal at the third stage) TM which is arranged on a lowermost side and is remotest from the display part AR is connected with the line layer 6 on a rightmost side via the contact hole TH and is insulated from the other line layers 6. In the same manner, the center terminal (the terminal at the second stage) TM which is arranged closer to the display part AR than the lowermost terminal TM is connected to the line layer 6 arranged second from the right side via the contact hole TH and is insulated from the other lien layers 6. In the same manner, the terminal (the terminal at the first stage) TM on an uppermost side which is arranged closer to the display part AR than the center terminal TM is connected to the line layer 6 arranged third from the right side via the contact hole TH and is insulated from the other line layers 6. Here, the connections between the terminals TM and the line layers 6 are not limited to the illustrated constitution, and a kind of terminal TM and a kind of line layer 6 to be connected with each other can be arbitrarily selected.

In FIG. 1C, an upper portion thereof is a plan view showing the terminal TM which is surrounded by a dotted line frame C in the drawing out of the respective terminals TM shown in FIG. 1A in an enlarged manner, and a lower portion thereof is a cross-sectional view taken along a line d-d in the plan view.

In the view at the lower portion of FIG. 1C, on the surface of the lower substrate 2, first of all, three line layers 6 which are arranged adjacent to each other are formed. Here, the line layers 6 may be formed on an insulation layer not shown in the drawing which is arranged below the line layers 6.

On the surface of the lower substrate 2 on which the respective line layers 6 are mounted in the above-mentioned manner, the first insulation film IN1 and the second insulation film IN2 are sequentially formed in a state that the first insulation film IN1 and the second insulation film IN2 also cover the respective line layers 6. When the bump electrodes BP on the semiconductor chip 4 and the corresponding terminals TM are electrically connected with each other, a relatively large pressure is applied to the insulation film which is formed to cover the respective line layers 6 by way of the terminals TM. For preventing the rupture of the insulation film, for example, as described above, the insulation film is constituted in two-layered structure formed of the first insulation film IN1 and the second insulation film IN2. From this viewpoint, the insulation film may be formed of a three-or-more-layered insulation film by further stacking other insulation films.

Further, the contact hole TH for exposing a portion of the line layer 6 which is positioned on a right side in the drawing is formed as a hole which sequentially penetrates the second insulation film IN2 and the first insulation film IN1.

Further, the terminal TM is formed on an upper surface of the second insulation film IN2, and the terminal TM is formed in a state that a width W of the terminal TM is set to a value which substantially agrees with a total parallel width w of three line layers 6 which are arranged adjacent to each other and is electrically connected to the line layer 6 which is positioned on a right side in the drawing via the contact hole TH. Further, the terminal TM is, for example, formed of an ITO (Indium Tin Oxide) film. The terminal TM is provided for preventing the occurrence of the electrolytic corrosion. From this point of view, the terminal TM may be formed of a sequentially stacked body which is constituted of a metal layer and an ITO film.

Here, the line layers 6 may be formed in the same step as the gate signal lines GL. The first insulation film IN1 may be formed in the same step as the gate insulation film. The second insulation film IN2 may be formed in the same step as the second insulation film IN2 arranged in the pixel. The terminals TM may be formed in the same step as the pixel electrodes PX. Accordingly, it is possible to manufacture the display device by merely changing mask patterns without increasing the number of processes.

When the terminals TM are terminals for applying a video signal to the line layers 6, the terminals TM may be electrically connected between the line layers 6 and the drain signal lines DL in the course of the manufacturing process, or the line layers 6 per se may be formed in the same step as the drain signal lines DL.

Figure 6A:
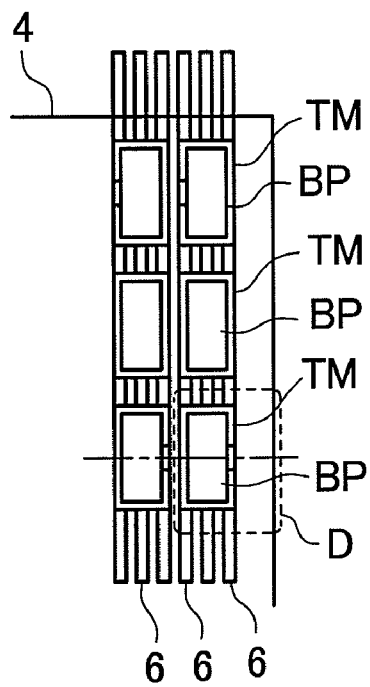
FIG. 6A to FIG. 6C are views showing another embodiment of the display device according to the present invention.

FIG. 6A is a view corresponding to FIG. 1A described above, and shows the positional relationship between the terminals TM and the bump electrodes BP of the semiconductor chip 4 when the semiconductor chip 4 is mounted on the lower substrate 2 by face down bonding. The bump electrodes BP shown in FIG. 6A are drawn in a see-through manner by omitting the semiconductor substrate, the package and the like of the semiconductor chip 4.

As can be understood from FIG. 6A, when each bump electrode BP on the semiconductor chip 4 has an area thereof set slightly smaller than an area of the terminal TM and the bump electrode BP which corresponds to the terminal TM is arranged at an accurate position, the bump electrode BP is arranged in a state that the terminal TM slightly projects from a periphery of the bump electrode BP. Here, the bump electrode BP is formed smaller than the terminal TM for preventing the bump electrode BP from being electrically connected to other neighboring bump electrodes BP.

Figure 6B:
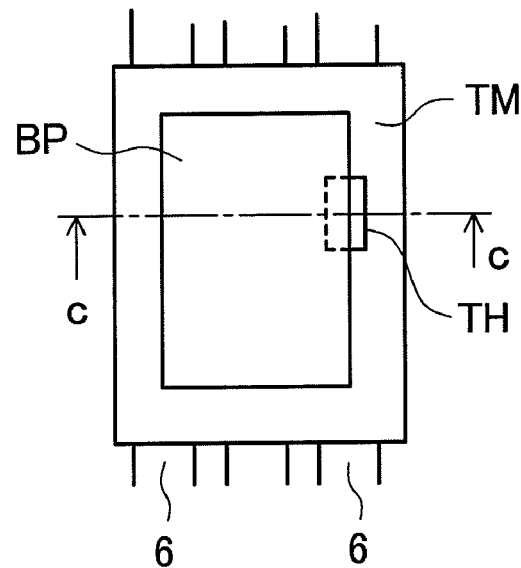

However, as shown in FIG. 6B which is an enlarged view of a portion indicated by a dotted line frame D in FIG. 6A, the terminal TM is formed with a size which allows the terminal TM to overlap all of three respective line layers 6 formed below the terminal TM. This constitution is provided for forming the bump electrode BP as large as possible with respect to the terminal TM, and due to such a constitution, it is possible to reduce resistance in connecting the bump electrode BP to the terminal TM.

Here, in this manner, the size of the bump electrode BP with respect to the terminal TM is determined by also taking positional displacement in the arrangement of the semiconductor chip 4 on the lower substrate 2 into consideration. That is, even when the positional displacement of the semiconductor chip 4 with respect to the lower substrate 2 occurs, the bump electrode BP is surely positioned on the terminal TM.

Figure 6C:
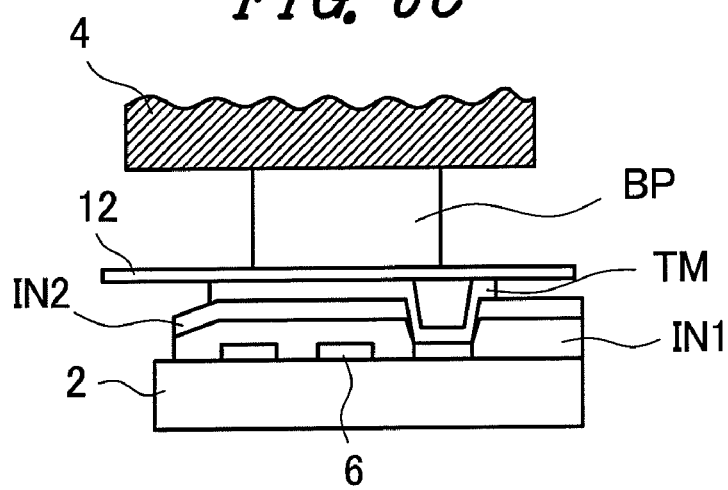

Further, the electrical connection of the bump electrode BP with respect to the terminal TM is, as shown in FIG. 6C which is a cross-sectional view taken along a line c-c in FIG. 6B, established via the anisotropic conductive film 12. The anisotropic conductive film 12 is, as described above, formed of a resin film in which a large number of granular conductive materials is scattered. By arranging the anisotropic conductive film 12 on a region of the lower substrate 2 on which at least the semiconductor chip 4 is mounted, and positioning and arranging the semiconductor chip 4 in a state that the respective bump electrodes BP face the respective corresponding terminals TM and, thereafter, applying a pressure to the semiconductor chip 4 toward the lower substrate 2, the electrical connection between the bump electrodes BP and the respective terminals TM can be established.

Here, the bump electrode BP may overlap or may not overlap the line layers 6 which are arranged adjacent to the line layer 6 corresponding to the bump electrode BP. For example, out of three terminals TM which are arranged on a rightmost-side row in FIG. 6A, the center terminal TM (a terminal on a second stage) corresponds to the line layer 6 second from a right side. The bump electrode BP which is connected to the terminal TM may overlap or may no overlap the line layers (the line layer on a rightmost side or third from the right side) 6 which are arranged adjacent to the line layer 6 second from the right side.

Here, in applying pressure to the semiconductor chip 4 toward the lower substrate 2, for preventing the rupture of the insulation films IN1, IN2 which are interposed between the terminal TM and the line layers 6, as described above, the insulation film IN is formed in two or more layers.

Figure 7A:
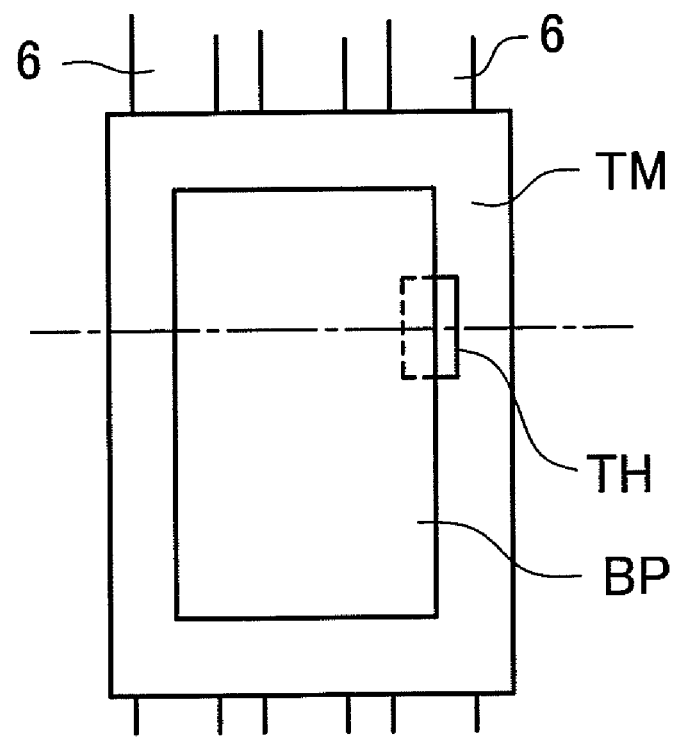
FIG. 7A and FIG. 7B are views showing another embodiment of the display device according to the present invention.
Figure 7B:
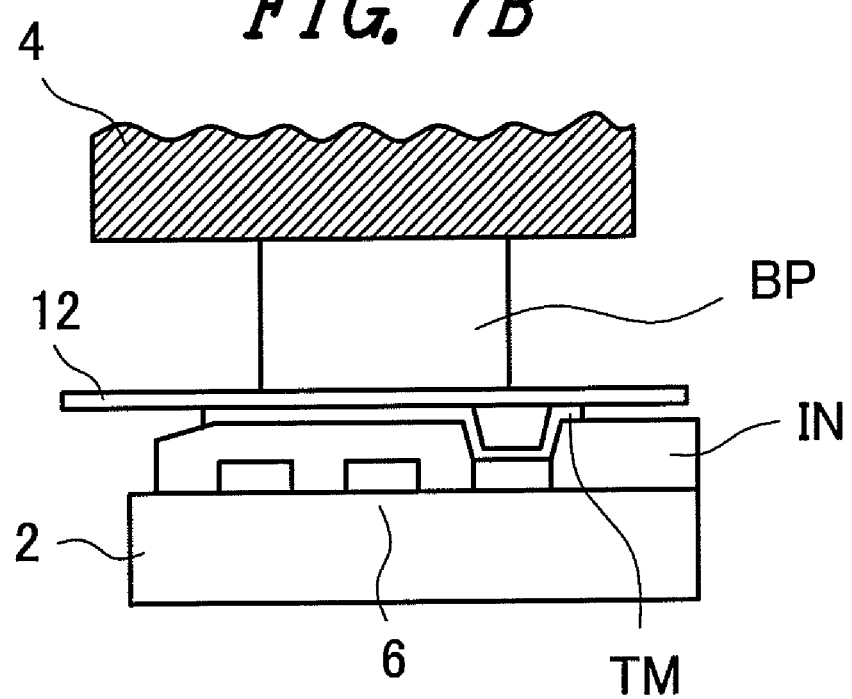

FIG. 7A to FIG. 7B are views for explaining another embodiment of the present invention. FIG. 7A to FIG. 7B are views which respectively correspond to FIG. 6B, FIG. 6C explained above. In FIG. 7A to FIG. 7B, the constitution which makes the embodiment explained in FIG. 7A to FIG. 7B different from the explained in FIG. 6B, FIG. 6C lies in that the insulation film IN which is interposed between the terminal TM and the line layers 6 adopts the single-layered structure.

In this case, as the insulation film IN, the first insulation film IN1 which functions as a gate insulation film in the thin film transistor TFT and is formed of a silicon nitride film is used, for example. Usually, the gate insulation film of the thin film transistor TFT is formed with high-temperature treatment for enhancing properties thereof, and the gate insulation film may be formed as an insulation film having a relatively higher strength than other insulation films. Accordingly, in applying the pressure to the semiconductor chip 4 toward the lower substrate 2 to connect the terminals TM and the bump electrodes BP, it is possible to prevent the rupture of the insulation film IN.

Here, also when the insulation film IN is formed in two or more layers, by forming one layer of the insulation film IN using a gate insulation film, it is possible to obtain the same advantageous effect as the above-mentioned embodiment.

Further, in this case, the insulation film IN arranged below the terminal TM is formed to cover the line layers 6. Below the terminal TM, the plurality of line layers 6 having a substantially same line width is arranged at substantially equal intervals.

It is preferable that the number of line layers 6 which overlap one terminal TM is set equal to the number of line layers 6 which overlap other terminal TM which differ from one terminal TM in distance from the display part AR as viewed in a plan view. Due to such a constitution, there is no possibility that a large stepped portion is formed on a surface of the insulation film IN which is formed to cover the line layers 6 and hence, the surface of the insulation film IN substantially becomes flat. Accordingly, the pressure which is applied to the insulation film IN by way of the terminals TM becomes uniform. Due to such a pressure dispersing effect, it is possible to obtain an advantageous effect that the insulation film IN hardly ruptures. Further, it is also possible to reduce the occurrence of connection failures between the terminals TM and the bump electrode BP attributed to the stepped portion.

Here, the explanation made heretofore is also applicable to a case in which the insulation film IN is formed in two or more layers.

FIG. 8A and FIG. 8B are views for explaining another embodiment of the present invention. FIG. 8A is a plan view showing, in a liquid crystal display device, a region on which the semiconductor chip 4 is mounted and a vicinity of the region.

Further, FIG. 8B shows the semiconductor chip 4 which is mounted on the lower substrate 2 of the liquid crystal display device 1 and, in the drawing, the bump electrodes BP on the semiconductor chip 4 are drawn in a see-through manner by omitting the semiconductor substrate, the package and the like.

Here, in the semiconductor chip 4, at least bump electrodes BP on a liquid-crystal-display-part-AR side, that is, the bump electrodes BP which are connected with respective terminals TM of line layers 6 which extend from a liquid crystal display part AR are formed in parallel at three stages, for example, in a state that groups of bump electrodes which are arranged in a longitudinal side of the semiconductor chip 4 are shifted along a short side of the semiconductor chip 4 without any change. Here, in the explanation made hereinafter, the groups of bump electrodes which are arranged in parallel at three stages may also be referred to as a multi-stage bump electrode group. For example, scanning signals or video signals are outputted from the groups of bump electrodes.

In FIG. 8A, the respective line layers 6 which extend to a region LT on which the semiconductor chip 4 is mounted from the liquid crystal display part AR are configured such that the line layers 6 are arranged at substantially equal intervals from a left side to a right side in the drawing, and these respective line layers 6 reach an inspection circuit thin film transistor ITFT described later.

In the region LT on which the semiconductor chip 4 is mounted, in a portion ranging from the liquid crystal display part AR to the inspection circuit thin film transistor ITFT, the terminals TM are respectively formed at positions which correspond to (face) the respective bump electrodes BP of the multi-stage bump electrode group of the semiconductor chip 4 thus constituting a multi-stage terminal group.

When these respective terminals TM are referred to as a first-stage terminal group, a second-stage terminal group and a third-stage terminal group from a side close to the liquid crystal display part AR to a side remote from the liquid crystal display part AR, the respective terminals TM which are sequentially arranged in the direction from a left side to a right side in the drawing, for example, at the first stage terminal group are arranged such that each terminal TM strides over three line layers 6 in the same direction, and such a relationship is also adopted by the second-stage terminal group and the third-stage terminal group.

Then, the respective terminals TM of the first-stage terminal group are electrically connected with the line layer 6 on the left side in the drawing out of three respective line layers 6 positioned below the terminals TM via contact holes TH, the respective terminals TM of the second-stage terminal group are electrically connected with the line layer 6 at the center out of three respective line layers 6 positioned below the terminals TM via contact holes TH, and the respective terminals TM of the third-stage terminal group are electrically connected with the line layer 6 on the right side in the drawing out of three respective line layers 6 positioned below the terminals TM via contact holes TH.

Here considered is a case in which these terminals TM are video signal terminals. In this case, when the respective line layers 6 are sequentially arranged from the right side to the left side in the drawing in order of the blue (B) line, the green (G) line, the red (R) line, the blue (B) line, the green (G) line, . . . for color display, in the semiconductor chip 4, a red (R) signal is outputted to the respective bump electrodes BP (first-stage bump electrode group) which are connected to the respective terminals TM of the first-stage terminal group, a green (G) signal is outputted to the respective bump electrodes BP (second-stage bump electrode group) which are connected to the respective terminals TM of the second-stage terminal group, and a blue (B) signal is outputted to the respective bump electrodes BP (third-stage bump electrode group) which are connected to the respective terminals TM of the third-stage terminal group.

This implies that, for example, when the circuit and the respective bump electrodes BP in the inside of the semiconductor chip 4 satisfy the above-mentioned relationship, it is possible to obtain an advantageous effect that, the circuit arrangement in the inside of the semiconductor chip 4 can be regularly performed by collectively arranging RGB.

The inspection circuit thin film transistor ITFT is provided for connecting the respective line layers 6 connected to the respective terminals TM to a first inspection terminal ITM1, a second inspection terminal ITM2 and a third inspection terminal ITM3, for example, and for releasing such connections.

That is, the inspection circuit thin film transistor ITFT constitutes a switching element in which the respective line layers 6 which are connected to the respective terminals TM are used as a first terminal, line layers (inspection line layers) 14 which are connected to the first inspection terminal ITM1, the second inspection terminal ITM2 and the third inspection terminal ITM3 are used as a second terminal, a semiconductor layer (not shown in the drawing) formed between the first terminal and the second terminal is used as a channel layer, and an electrode formed below the semiconductor layer is used as a gate electrode 15.

Then, for example, when the inspection circuit thin film transistor ITFT is turned on, the line layers 6 which are connected with the respective terminals TM of the first stage are connected with the third inspection terminal ITM3 via the line layer (inspection line layer) 14, when the inspection circuit thin film transistor ITFT is turned on, the line layers 6 which are connected with the respective terminals TM of the second stage are connected with the second inspection terminal ITM2 via the line layer (inspection line layer) 14, and when the inspection circuit thin film transistor ITFT is turned on, the line layers 6 which are connected with the respective terminals TM of the third stage are connected with the first inspection terminal ITM1 via the line layer (inspection line layer) 14. In this manner, the line layers 6 are connected with the inspection terminals ITM1, ITM2 and ITM3 via the switching element ITFT.

In this case, the respective line layers 14 which reach the respective inspection terminals ITM from the inspection circuit thin film transistor ITFT have portions thereof intersect each other and hence, insulation layers 16 are formed on at least such intersecting portions to ensure the insulation.

Such inspection terminals and the switching element may be formed in the same manner also with respect to the terminals TM for applying the scanning signal. In this case, terminals TM may be divided into two groups consisting of even-numbered rows and odd-numbered rows, for example, instead of a group consisting of three colors of RGB.

Next, another advantageous effect obtained by multi-stage bumps which does not adopt the staggered arrangement is explained.

In case of the multi-stage bump which adopts the staggered arrangement, the semiconductor chip 4 has a plurality of bump electrodes BP on one long side thereof, and the plurality of bump electrodes BP are arranged at two or more stages in the short direction of the semiconductor chip 4. In the plurality of bump electrodes BP, positions of the first-stage bump electrodes BP in the longitudinal direction of the semiconductor chip 4 are shifted with respect to positions of the second-stage bump electrodes BP in the longitudinal direction of the semiconductor chip 4. To the contrary, when the multi-stage bumps does not adopt the staggered arrangement, in the plurality of bump electrodes BP, the positions of the first-stage bump electrodes BP in the longitudinal direction of the semiconductor chip 4 are not shifted with respect to the positions of the second-stage bump electrodes BP in the longitudinal direction of the semiconductor chip 4.

Also in case of the multi-stage bump which does not adopt the staggered arrangement, the electrical connection between the respective bump electrodes BP on the semiconductor chip 4 and the corresponding terminals TM is established, as described above, by applying pressure to the semiconductor chip 4 toward the lower substrate 2 while interposing the anisotropic conductive film 12 between the lower substrate 2 and the semiconductor chip 4.

In case of the multi-stage bump which does not adopt the staggered arrangement, compared to a case in which the multi-stage bumps adopts the staggered arrangement, it is possible to largely suppress the probability that a drawback that the neighboring bump electrodes (terminals TM) BP are electrically short-circuited due to conductive-material particles in the inside of the anisotropic conductive film 12 arises. That is, in case of the multi-stage bump which does not adopt the staggered arrangement, with respect to the above-mentioned respective bump electrodes BP (terminals TM), the bump electrode (terminal) groups which are arranged in one direction are formed in parallel in multi stages in a state that the bump electrode groups are shifted in the direction orthogonal to one direction without any change (the shifted state as it is implies that the position of the bump electrodes BP at the first stage in the above-mentioned one direction is equal to the position of the bump electrodes BP at the second stage in the above-mentioned one direction) and hence, the regions between these respective bump electrodes BP (terminals TM) are formed as regular matrix pattern. Accordingly, when a pressure is applied to the semiconductor chip 4 toward the lower substrate 2 by way of the anisotropic conductive film 12, the regions between the respective bump electrodes BP (terminals TM) form moving passages for the conductive-material particles in the inside of the anisotropic conductive film 12 thus making the movement of the conductive-material particles smooth whereby there is no possibility that the conductive-material particles are clogged between the neighboring bump electrodes (pad portions). Accordingly, compared to the bumps which adopt the staggered arrangement, the bumps of this embodiment exhibit the favorable flow of the conductive-material particles thus effectively preventing the occurrence of short-circuiting.

FIG. 9A and FIG. 9B are views showing another embodiment of the liquid crystal display device according to the present invention and correspond to FIG. 8A and FIG. 8B. The constitution which makes this embodiment differ from the constitution shown in FIG. 8A and FIG. 8B lies in that the so-called staggered pattern is adopted as the arrangement of terminals TM.

That is, in the same manner as the embodiment shown in FIG. 8A and FIG. 8B, respective terminals TM are arranged at three stages. However, a point which makes this embodiment different from the embodiment shown in FIG. 8A and FIG. 8B lies in that a terminal group of second stage is arranged in a displaced manner with respect to a terminal group of first stage by, for example, a ⅓ pitch in the right direction in the drawing, and a terminal group of third stage is arranged in a displaced manner with respect to a terminal group of second stage by, for example, a ⅓ pitch in the right direction in the drawing.

Due to such arrangement of the respective terminals TM, the arrangement of the respective terminals TM is set such that the positions of contact holes TH of the respective terminals TM are arranged at the substantially same position (at the center in this case) in any stage.

For example, the above-mentioned respective terminals TM are electrically connected with the line layers 6 which run at substantially center portions of the terminals TM via the contact holes TH formed in an insulation film IN. That is, the respective terminals TM can make the contact holes TH positioned at center portions thereof and hence, it is possible to obtain an advantageous effect that a connection state of the terminal TM with the bump electrode BP of the semiconductor chip 4 can be made uniform with respect to the respective terminals TM.

This relationship is also applicable to next three neighboring respective line layers 6 and the terminals TM which are connected with the respective line layers 6, and the relationship is also applicable to further next three neighboring respective line layers 6 and the terminals TM which are connected with the respective line layers 6.

In adopting the constitution shown in FIG. 9A and FIG. 9B, it is needless to say that the semiconductor chip 4 which is connected with the terminals TM has, as shown in FIG. 9B, the bump electrodes BP formed in the arrangement corresponding to arrangement of the terminals TM. Here, FIG. 9B is a view which depicts the bump electrodes BP in a see-through manner by omitting a semiconductor substrate, a package or the like of the semiconductor chip 4.

Figure 10A:
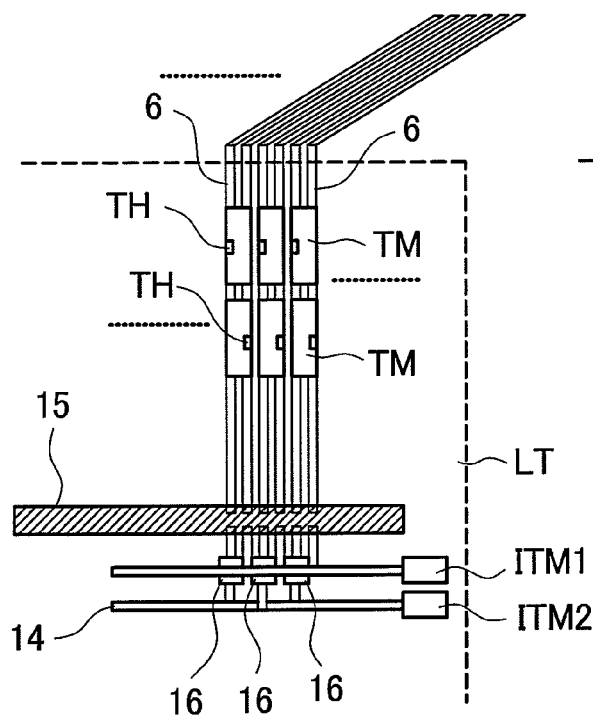
FIG. 10A and FIG. 10B are views showing another embodiment of the display device according to the present invention.
Figure 10B:
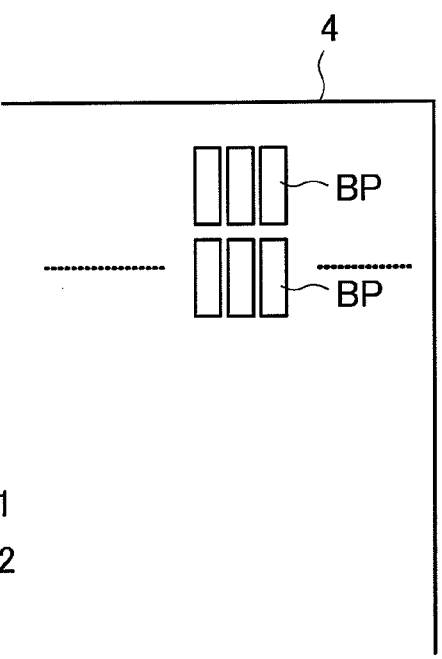

FIG. 10A and FIG. 10B are views showing another embodiment of the liquid crystal display device according to the present invention and correspond to FIG. 8A and FIG. 8B.

The constitution shown in FIG. 10A and FIG. 10B which makes this embodiment differ from the constitution shown in FIG. 8A and FIG. 8B lies in bump electrodes BP which are connected with terminals TM of line layers 6 which extend from the liquid crystal display part AR out of the bump electrodes BP of the semiconductor chip 4. That is, bump electrode groups which are arranged along a longitudinal side of the semiconductor chip 4 are shifted to a short side of the semiconductor chip 4 without any change and are arranged in parallel at two stages.

Corresponding to such an arrangement, on respective line layers 6 which are arranged in parallel in a region LT on which the semiconductor chip 4 is mounted on the above-mentioned lower substrate 2, the terminals TM to be connected to the bump electrodes BP are formed to stride over two neighboring line layers 6 respectively. That is, with respect to the respective terminals TM, the terminal groups which are arranged in the parallel direction of the respective line layers 6 are arranged in parallel at two stages in a state that the terminal groups are shifted in the extending direction of the respective line layers 6. Here, the respective terminals TM of the first-stage terminal group are electrically connected with, for example, the line layer 6 on a left side in the drawing out of two line layers 6 below the first-stage terminal group via the contact hole TH, and the respective terminals TM of the second-stage terminal group are electrically connected with, for example, the line layer 6 on a right side in the drawing out of two line layers 6 below the second-stage terminal group via the contact hole TH.

From the above, such multi-stage constitution of the terminals TM connected to the line layer 6 is not limited to two stages or three stages, and may be four or more stages. That is, the terminals TM may be formed at n stages in a state that the terminal groups which are arranged in parallel while covering the line layers 6 which are arranged adjacent to each other in the parallel direction of the respective line layers 6 for every n (n being 2 or more) pieces of the line layers 6 are shifted in the longitudinal direction of the line layers 6. Further, respective n pieces of terminals TM which are formed to cover the same n pieces of line layers may be electrically connected with the line layers 6 different from each other via contact holes TH formed in the above-mentioned insulation film IN.

Figure 11A:
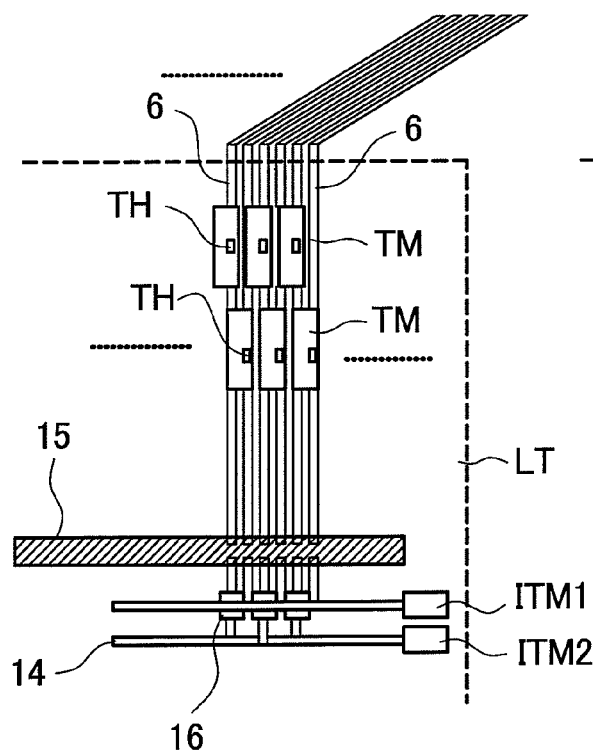
FIG. 11A and FIG. 11B are views showing another embodiment of the display device according to the present invention.
Figure 11B:
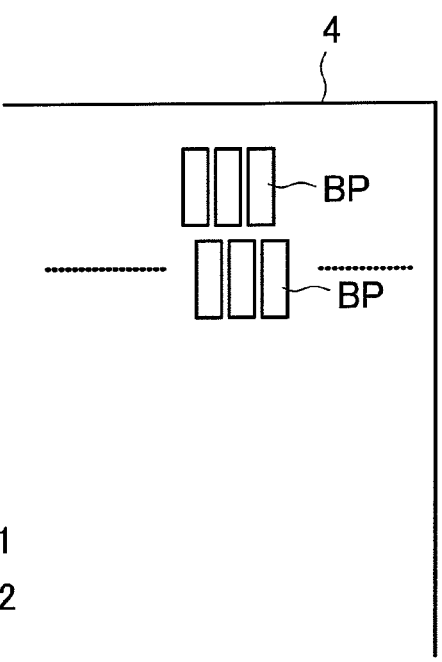

FIG. 11A and FIG. 11B are views showing another embodiment of the liquid crystal display device according to the present invention and correspond to FIG. 10A and FIG. 10B.

To compare the constitution of this embodiment shown in FIG. 11A and FIG. 11B with the constitution of the embodiment shown in FIG. 10A and FIG. 10B, in the same manner as the constitution of the embodiment shown in FIG. 10A and FIG. 10B, bump electrodes BP which are connected with terminals TM of line layers 6 which extend from the liquid crystal display part AR out of the bump electrodes BP of the semiconductor chip 4 are formed as bump electrode groups at two stages. However, this embodiment shown in FIG. 11A and FIG. 11B differs from the embodiment shown in FIG. 10A and FIG. 10B with respect to the constitution that the bump electrode group at the second stage is arranged in a shifted manner with respect to the bump electrode group at the first stage by a half pitch of the bump electrodes. That is, the respective bump electrodes BP are arranged in a so-called staggered pattern.

Corresponding to such arrangement, terminals TM which are formed on a region LT on which a semiconductor chip 4 is mounted on a lower substrate 2 are also arranged in a staggered pattern. That is, the respective terminals TM is constituted of a terminal group of a first stage which is arranged along the parallel direction of the respective line layers 6 and a terminal group of a second stage which is shifted with respect to the terminal group of the first stage by a half pitch of the terminals TM after the terminal group of the first stage is shifted without any change in the extending direction of the respective layers 6.

The respective terminals TM of the terminal group of the first stage are electrically connected with the line layer 6 on a right side in the drawing, for example, out of two line layers 6 below the terminals TM via the contact holes TH, and the respective terminals TM of the terminal group of the second stage are electrically connected with the line layer 6 on a right side in the drawing, for example, out of two line layers 6 below the terminals TM via the contact holes TH.

In this case, as shown in FIG. 11A, at terminals TM on one end side of another terminal group arranged such that one ends thereof project toward one terminal group, there may be a case in which the terminal TM is formed on one line layer 6 and the terminal TM does not stride over two line layers 6. However, this arrangement does not generate any significant drawback.

From the above, such multi-stage constitution of the terminals TM connected to the line layer 6 is not limited to two stages or three stages, and may be four or more stages. That is, the terminals TM may be formed at n stages in a state that the terminal groups which are arranged in parallel while covering the line layers 6 which are arranged adjacent to each other in the parallel direction of the respective line layers 6 for every n (n being 2 or more) pieces of the line layers 6 are shifted in the longitudinal direction of the line layers 6 and, thereafter, the terminals TM are formed in a state that the terminals TM are shifted by a 1/n pitch. Further, respective n pieces of terminals TM which are formed to cover the same n pieces of line layers may be connected with the line layers 6 different from each other via contact holes TH formed in the above-mentioned insulation film IN.

In any one of the embodiments explained heretofore, a distance between the neighboring line layers 6 can be narrowed and, at the same time, an area of the terminal TM of the line layer 6 which is connected with the bump electrode BP of the semiconductor chip 4 can be increased.

In the above-mentioned respective embodiments, the present invention is explained by taking the liquid crystal display device 1 as an example. However, the present invention is not limited to the liquid crystal display device 1 and the present invention is applicable to other display device such as an organic EL display device, for example. This is because that also in the organic EL display device, for example, the semiconductor chip formed of a display drive circuit is mounted on a portion other than a display part AR (peripheral portion).

The above-mentioned respective embodiments may be used in a single form or in combination. This is because that the advantageous effects of the respective embodiments can be obtained singularly or synergistically.

What is claimed is:

1. A display device comprising:
   a substrate having a display part and a peripheral portion; and
   a semiconductor chip which is mounted on the peripheral portion of the substrate;
   wherein the semiconductor chip includes a first bump electrode;
   wherein the substrate includes a first line which connects to one line of the display part, a second line which connects to another line of the display part and is arranged adjacent to the first line, an insulation film which covers the first line and the second line, a first contact hole formed in the insulation film, and a first terminal which is formed so as to extend over the insulation layer film and is connected to the first line via the first contact hole;
   wherein the first line and the second line are arranged in parallel and constitute the same line layer on the substrate;
   wherein the first bump electrode is connected with the first terminal;
   wherein the second line is electrically insulated from the first terminal;
   wherein the first bump electrode is arranged to overlap the second line by way of the insulation film as viewed in a plan view;
   wherein the semiconductor chip includes a second bump electrode;
   wherein the substrate includes a second terminal which is formed so as to extend over the insulation film and is connected to the second bump electrode;
   wherein a distance between the first terminal and the display part differs from a distance between the second terminal and the display part; and
   wherein a number of lines on the substrate which overlap the first terminal is equal to a number of lines on the substrate which overlap the second terminal as viewed in a plan view.

* * * * *